(12) United States Patent
Deruty

(10) Patent No.: US 12,190,901 B2
(45) Date of Patent: Jan. 7, 2025

(54) SIGNAL PROCESSING

(71) Applicant: Sony Group Corporation, Tokyo (JP)

(72) Inventor: Emmanuel Deruty, Stuttgart (DE)

(73) Assignee: Sony Group Corporation, Tokyo (JP)

( * ) Notice: Subject to any disclaimer, the term of this patent is extended or adjusted under 35 U.S.C. 154(b) by 306 days.

(21) Appl. No.: 17/437,835

(22) PCT Filed: Feb. 28, 2020

(86) PCT No.: PCT/EP2020/055271
§ 371 (c)(1),
(2) Date: Sep. 10, 2021

(87) PCT Pub. No.: WO2020/200595
PCT Pub. Date: Oct. 8, 2020

(65) Prior Publication Data
US 2022/0157330 A1    May 19, 2022

(30) Foreign Application Priority Data

Mar. 29, 2019    (EP) .................................... 19166344

(51) Int. Cl.
*G10L 21/034*    (2013.01)
*G10L 25/21*    (2013.01)
(52) U.S. Cl.
CPC ............ *G10L 21/034* (2013.01); *G10L 25/21* (2013.01)
(58) Field of Classification Search
CPC . G06F 16/683; G06F 16/68; G11B 20/10527; G11B 2020/10555
USPC ........................................................ 700/94
See application file for complete search history.

(56) References Cited

U.S. PATENT DOCUMENTS

| | | | |
|---|---|---|---|
| 8,320,554 B1 * | 11/2012 | Chu ..................... | H04M 9/082 379/406.08 |
| 8,965,756 B2 | 2/2015 | Duwenhorst et al. | |
| 9,378,754 B1 * | 6/2016 | Every ................. | G10L 21/0272 |
| 9,947,338 B1 * | 4/2018 | Koteshwara ............ | H04R 5/02 |
| 11,610,610 B1 * | 3/2023 | Vajpayee ............... | G11B 27/10 |
| 2012/0063615 A1 | 3/2012 | Crockett et al. | |

(Continued)

FOREIGN PATENT DOCUMENTS

WO    2019/068915 A1    4/2019

OTHER PUBLICATIONS

International Search Report and Written Opinion mailed on Apr. 1, 2020, received for PCT Application PCT/EP2020/055271, Filed on Feb. 28, 2020, 10 pages.

(Continued)

*Primary Examiner* — Alexander Krzystan
(74) *Attorney, Agent, or Firm* — XSENSUS LLP

(57) ABSTRACT

A signal processing method comprises comparing a first frequency domain representation of a sequence of power values for respective windows of source input samples of a source input signal with a second frequency domain representation of a sequence of power values for respective windows of target input samples of a target input signal so as to generate a frequency domain difference representation; inverse-frequency-transforming the frequency domain difference representation to generate a modification indication; and applying the modification indication to the source input samples to generate respective output samples of an output signal.

24 Claims, 12 Drawing Sheets

(56) References Cited

U.S. PATENT DOCUMENTS

| | | | | |
|---|---|---|---|---|
| 2013/0002797 | A1* | 1/2013 | Thapa | H04M 3/568 |
| | | | | 348/E7.083 |
| 2014/0278380 | A1 | 9/2014 | Gunawan et al. | |
| 2015/0271616 | A1* | 9/2015 | Kechichian | H04R 3/002 |
| | | | | 381/58 |
| 2017/0251323 | A1* | 8/2017 | Jo | H04S 5/005 |
| 2017/0330570 | A1* | 11/2017 | Srinivasan | G10L 19/018 |
| 2021/0360313 | A1* | 11/2021 | Dean | H04N 21/8456 |

OTHER PUBLICATIONS

Townsend, "Dynamic Equalizers, Part Two: Spectrum Matching with MAutoDynamicEQ", Available Online at: http://soundbytesmag.net/meldaproductionmautodynamiceq/, Jul. 2014, pp. 1-15.

Liu et al., "Audio Feature Extraction and Analysis for Scene Segmentation and Classification", Journal of VLSI Signal Processing, vol. 20, XP-000786728, 1998, pp. 61-79.

"Loudness Range: a Measure to Supplement EBU R 128 Loudnes Normalization", EBU Operation Eurovision and Euroradio, Tech 3342, Version 3.0, Jan. 2016, pp. 1-9.

Ian Stewart, "How to Use Match EQ in Ozone 9", IZotope, https://www.izotope.com/en/learn/how-to-use-match-eq-in-ozone-9.html, Oct. 3, 2019, pp. 1-12.

"A-weighting", https://en.wikipedia.org/wiki/A-weighting, Aug. 27, 2021, pp. 1-9.

"Algorithms to measure audio programme loudness and true-peak audio level", International Telecommunication Union, ITU-R Radiocommunication Sector of ITU, R-REC-BS.1770-2-, PDF-E Recommendation ITU-R BS.1770-2 (Mar. 2011), pp. 1-24.

"Acoustics—Normal equal-loudness-leven contours", International Standard, ISO 226:2003, Aug. 15, 2003, pp. 1-26.

"Logic Pro Match EQ overview", Aug. 26, 2021. htttps://support.apple.com/en-gb/guide/logicpro/lgcef1edbfbe/mac.

* cited by examiner

Target

Source

Modification

Output

SIGNAL PROCESSING

CROSS-REFERENCE TO RELATED APPLICATIONS

The present application is based on PCT filing PCT/EP2020/055271, filed Feb. 28, 2020, which claims priority to EP 19166344.2, filed Mar. 29, 2019, the entire contents of each are incorporated herein by reference.

BACKGROUND

Field

This disclosure relates to signal processing.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly or impliedly admitted as prior art against the present disclosure.

Techniques exist for conforming the spectrum of a source audio signal to that of a target audio signal.

There is a need for alternative techniques for matching aspects of a source audio signal to that of a target audio signal (or indeed to do similar operations for non-audio signals).

SUMMARY

The present disclosure provides a signal processing method comprising:
  comparing a first frequency domain representation of a sequence of power values for respective windows of source input samples of a source input signal with a second frequency domain representation of a sequence of power values for respective windows of target input samples of a target input signal so as to generate a frequency domain difference representation;
  inverse-frequency-transforming the frequency domain difference representation to generate a modification indication; and
  applying the modification indication to the source input samples to generate respective output samples of an output signal.

The present disclosure also provides a signal processing method comprising:
  detecting a sequence of power values for respective windows of input samples of an input signal;
  generating a frequency domain representation of the sequence of power values; and
  providing the frequency domain representation of the sequence of power values as a metadata signal to accompany the input signal.

The present disclosure also provides signal processing apparatus comprising:
  comparator circuitry configured to compare a first frequency domain representation of a sequence of power values for respective windows of source input samples of a source input signal with a second frequency domain representation of a sequence of power values for respective windows of target input samples of a target input signal so as to generate a frequency domain difference representation;
  transform circuitry configured to inverse-frequency-transform the frequency domain difference representation to generate a modification indication; and
  output circuitry to apply the modification indication to the source input samples to generate respective output samples of an output signal.

The present disclosure also provides signal processing apparatus comprising:
  detector circuitry configured to detect a sequence of power values for respective windows of input samples of an input signal;
  generator circuitry configured to generate a frequency domain representation of the sequence of power values; and
  output circuitry configured to provide the frequency domain representation of the sequence of power values as a metadata signal to accompany the input signal.

Further respective aspects and features of the present disclosure are defined in the appended claims.

It is to be understood that both the foregoing general description and the following detailed description are exemplary, but are not restrictive, of the present technology.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, in which.

DESCRIPTION OF THE PREFERRED EMBODIMENTS

Figure 1:
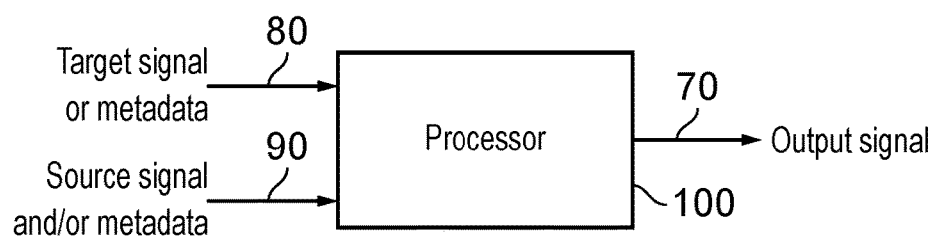
FIG. 1 schematically illustrates a signal processor.

Referring now to the drawings, FIG. 1 schematically illustrates a signal processor 100 which receives a source input signal 90 and/or metadata defining properties of the source input signal, along with a target input signal or metadata defining properties of the target input signal 80. The use of metadata will be discussed further below. The signal processor applies a processing operation so as to generate an output signal 70 which contains the actual content of the source input signal but with the spectrum of its envelope modified to be the same as or at least closer to that of the target input signal.

This processing operation will be referred to below as so-called "dynamic matching". Its aim is to impose on the source input signal a dynamic behaviour that is abstracted from properties of the target input signal. Such a dynamic matching process may involve for example at least partly conforming the dynamics of a source signal to that of a target audio signal.

Purely by way of example, a possible use of the dynamic matching process is in the generation of alternate language voice files to be used in, for example, a video game soundtrack. Typically in a video game situation, the game is authored with a single primary language voice track (often but not always in English) and, although the voice track may include a very large number of individual voice files, it is often the case that a lot of effort is applied to the process of mixing the voice track in the primary language. Then, however, if the game is to be sold with other language variants, it is necessary to generate corresponding voice tracks in each language. To apply the same effort in terms of audio mixing to those alternate language voice tracks would potentially be uneconomic, but by using the dynamic matching process summarised with reference to FIG. 1 and described in more detail below, a similar "feel" or loudness behaviour can be obtained for the listener in each of the languages by imposing the dynamic behaviour of the target input signal (in this example, a particular voice track representing a portion of dialogue in the primary language) to each individual source input signal (in this example, the corresponding portion of dialogue in one of the alternate languages).

Note that although the example situation just described relates to audio signals, in fact the target input signal, source input signal and output signal could be audio signals or could be signals representing other values and in general are simply defined as a sequence of values which may (for convenience of the processing) be normalised to a given range.

Figure 2A:
FIGS. 2a to 2d are schematic diagrams illustrating a signal processing operation.
Figure 2B:

FIGS. 2a to 2d are schematic diagrams illustrating such a signal processing operation. In FIG. 2a, the temporal envelope of the target input signal is shown, with a time access running from left to right as drawn. FIG. 2b shows an example temporal envelope of the source input signal on the same time axis.

Figure 2C:
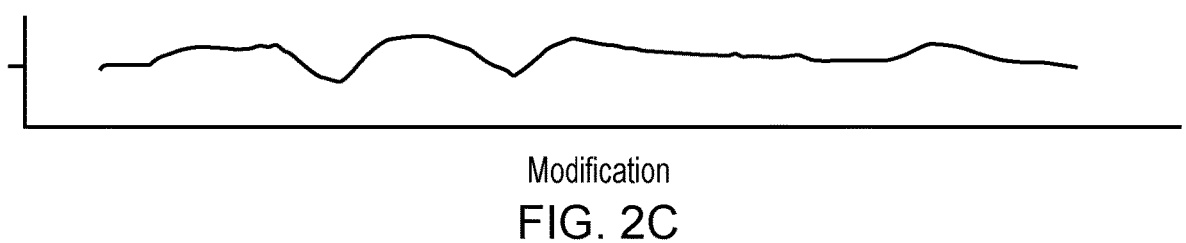
Figure 2D:
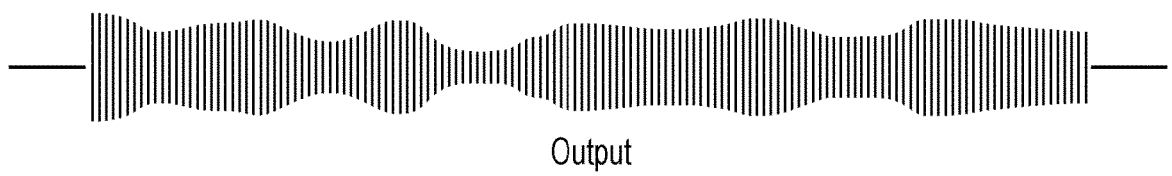

As part of the processing operations carried out by the signal processor 100, a modification indication (FIG. 2c) is generated which, when applied to the source input signal of FIG. 2b as a gain modification or the like, produces the output signal of FIG. 2d which contains the content of the source input signal but exhibits the dynamic behaviour of the target input signal.

By way of summary, an overview of signal processing methods will now be described, with a more detailed discussion being given below.

Figure 3:
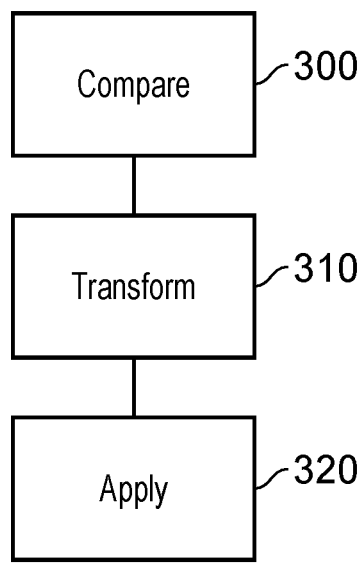
FIGS. 3 and 4 are schematic flowcharts illustrating respective methods.

FIG. 3 is a schematic flowchart illustrating a summary signal processing method comprising:
  comparing (at a step 300) a first frequency domain representation of a sequence of power values for respective windows of source input samples of a source input signal with a second frequency domain representation of a sequence of power values for respective windows of target input samples of a target input signal so as to generate a frequency domain difference representation;
  inverse-frequency-transforming (at a step 310) the frequency domain difference representation to generate a modification indication; and
  applying (at a step 320) the modification indication to the source input samples to generate respective output samples of an output signal.

Figure 4:
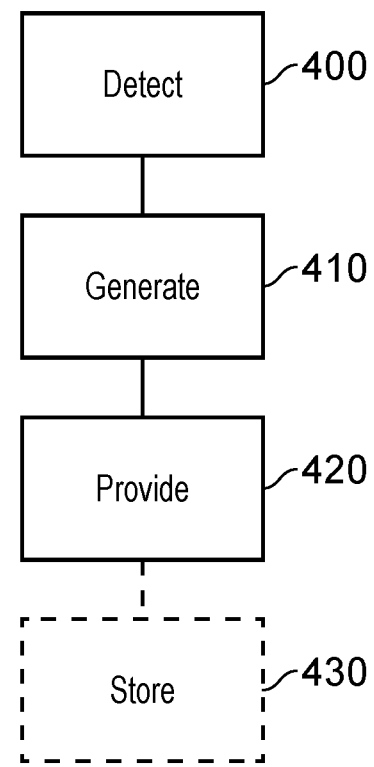

FIG. 4 is a schematic flowchart illustrating a signal processing method comprising:
  detecting (at a step 400) a sequence of power values for respective windows of input samples of an input signal;
  generating (at a step 410) a frequency domain representation of the sequence of power values; and
  providing (at a step 420) the frequency domain representation of the sequence of power values as a metadata signal to accompany the input signal.

Note that other data can also be included with the metadata, and examples will be given below.

Figure 5:
FIG. 5 schematically illustrates a storage medium.

An optional final step 430 can be employed to store the signal and metadata on a storage medium such as a non-transitory machine-readable storage medium (for example the medium 500 of FIG. 5).

Figure 6:
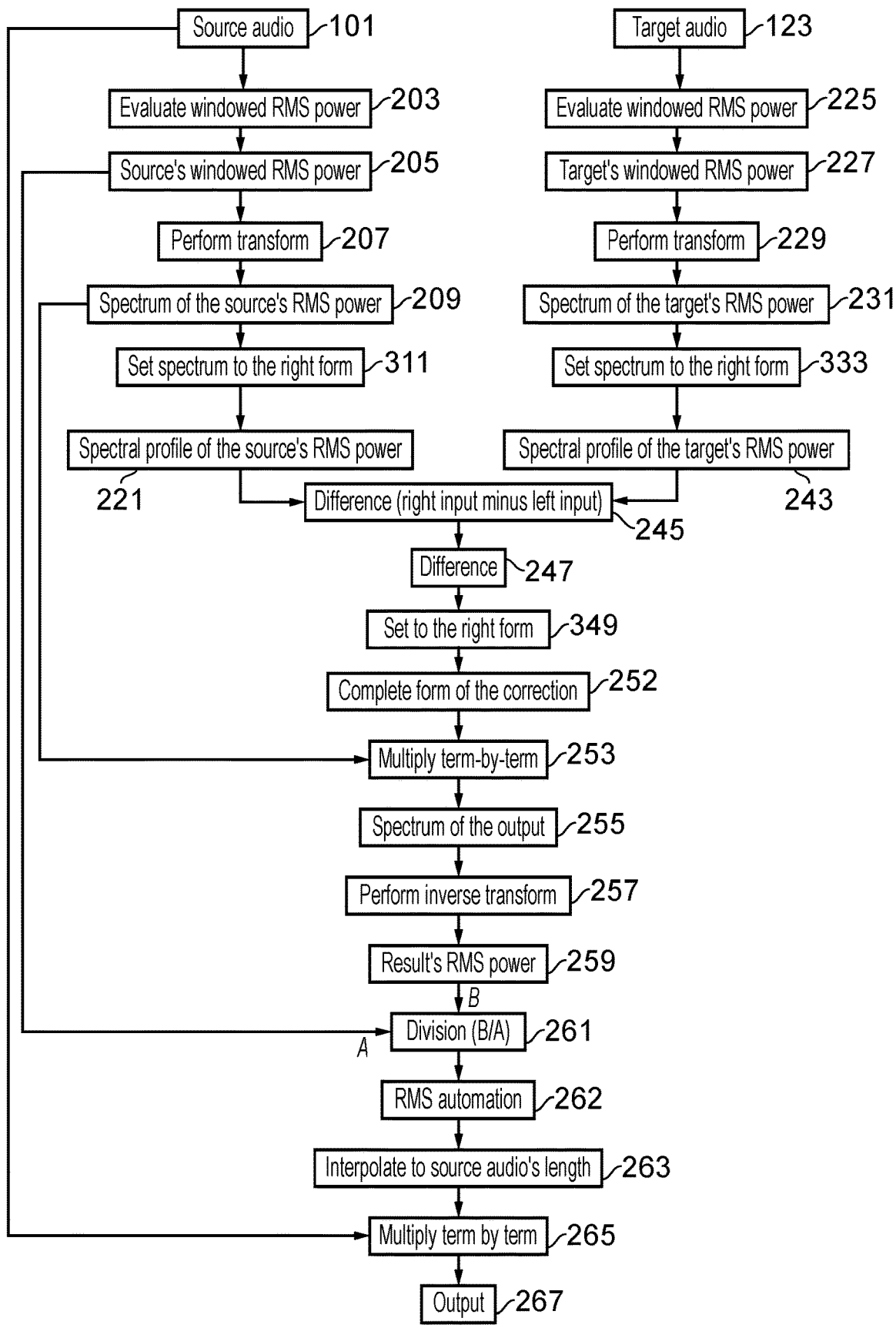
FIGS. 6 and 7 are schematic flowcharts illustrating respective methods.
Figure 7:
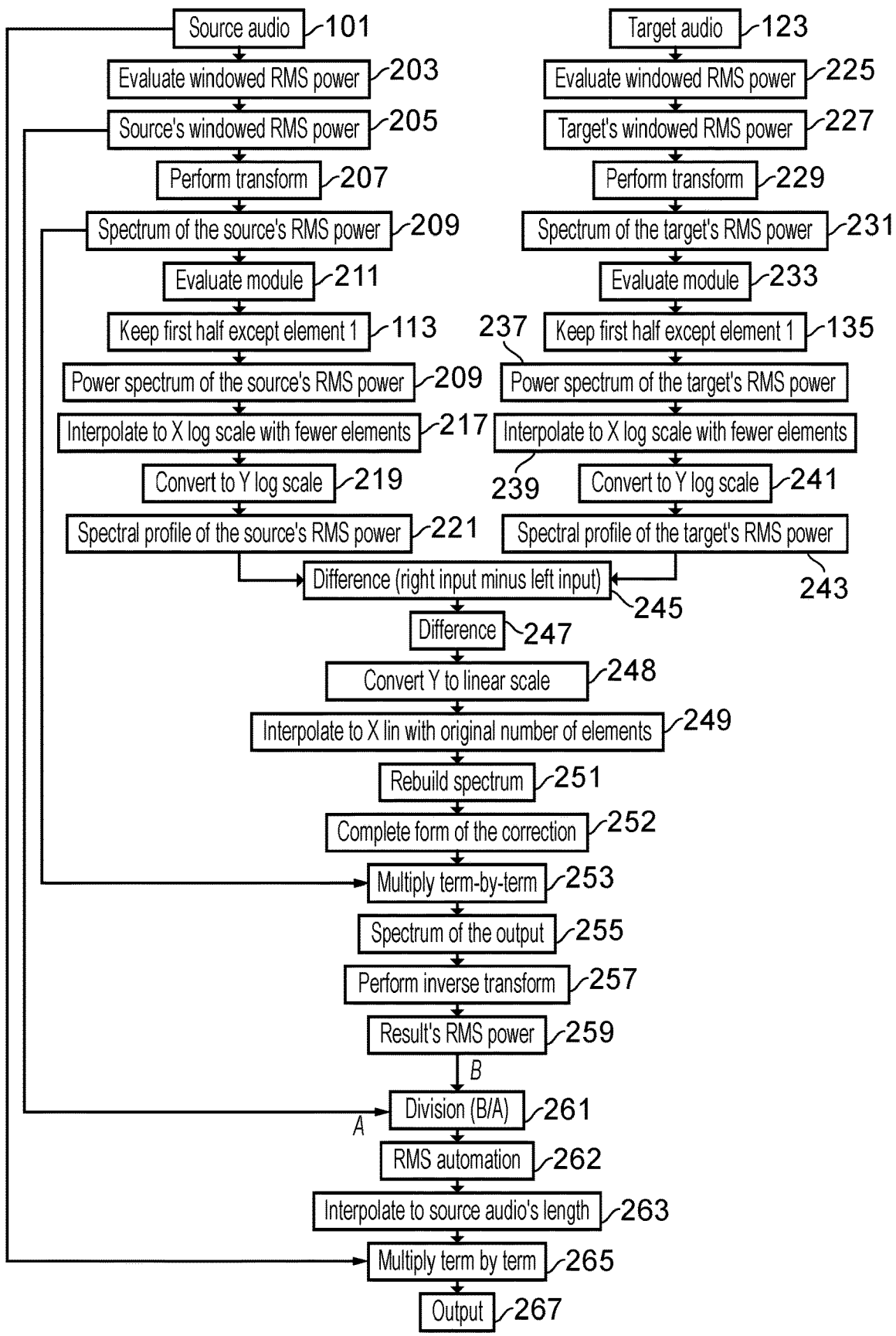

FIGS. 6 and 7 are schematic flow charts illustrating the example dynamic matching process in more detail. In particular, FIG. 6 provides an intermediate level of detail and FIG. 7 expands on certain aspects of FIG. 6 to provide a greater level of detail of an example embodiment. Reference is also made to FIGS. 8 to 19 which illustrate some of the stages in the process.

As mentioned, an aim of the process to be discussed is to make a source input signal sound more like (in the example of audio signals) a target input signal in terms of its dynamic properties, by generating an output signal as a modified version of the source input signal. The example to be discussed will be referenced to audio signals for clarity of the explanation but this is not an essential feature of the present disclosure.

The process as shown in FIG. 6 starts with a source audio signal 101. This is represented as successive audio samples at a sampling rate (for example of 44.1 kHz), but as discussed above may be a different format of audio signal or indeed another numeric signal altogether. For convenience, the audio samples may be normalised (for example to a range between −1 and +1) but this is not essential to the process to be described.

At a step 203, the root mean square (RMS) power is evaluated for respective windows of the source input samples of the signal 101. These windows may be successive (adjacent and contiguous) or may be overlapping, or may be intermittent with respect to the time axis of the source audio signal. The windows may be all of the same length (for example, equivalent to 50 ms (milliseconds) of the source audio signal 101, or at least a range within an order of magnitude of 50 ms) or may have different lengths. For convenience, a system of successive contiguous windows of the same length (at least a consistent length for an individual input signal) is used.

The RMS power is evaluated for each of the windows giving a set of power values 205 representing the windows RMS power values.

Figure 8:
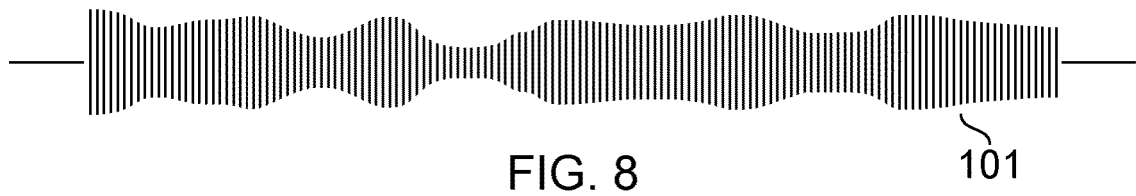
FIGS. 8 to 19 are schematic diagrams illustrating a signal processing operation.
Figure 9:
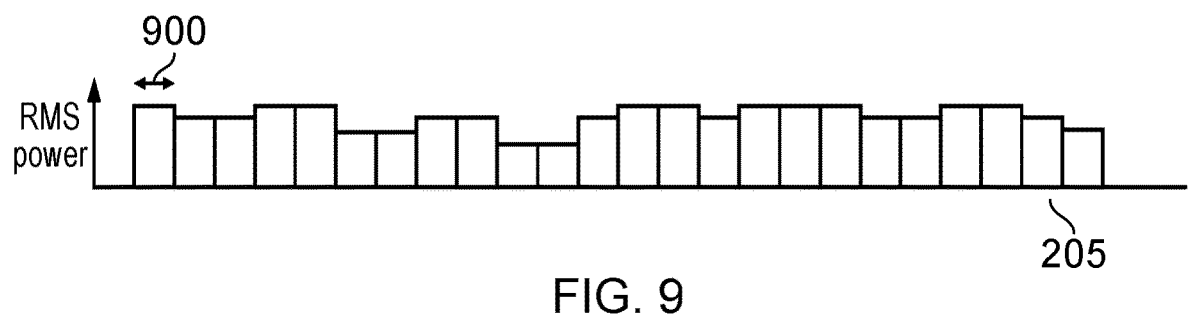

To assist in this discussion, FIGS. 8 to 19 are schematic diagrams illustrating various stages in the signal processing operations to be described. FIG. 8 represents the source audio signal 101 on a time axis running from left to right, and FIG. 9 schematically illustrates the windowed RMS power values 205, again on a time axis running from left to right. Each window has a window length 900 and in the example shown, the windows all have the same window length and are contiguous. The RMS power is shown on a vertical axis in FIG. 9.

At a step 207, a time to frequency domain transform is performed on the windowed RMS power values 205, such as a fast Fourier transform (FFT), to generate the spectrum 209 (FIG. 10) of the windowed RMS power values.

Figure 10:
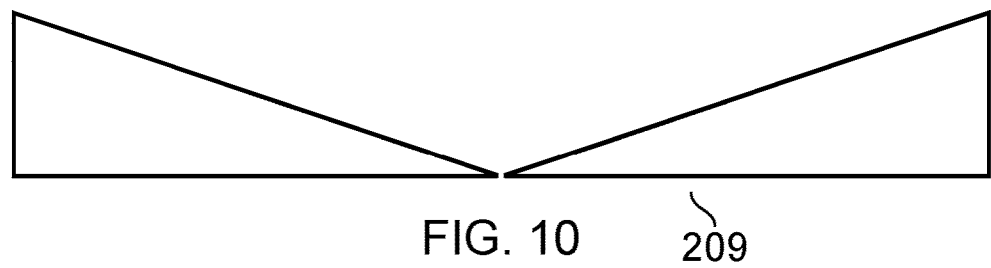
Figure 11:
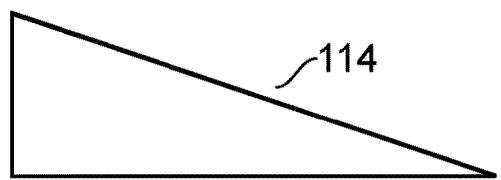
Figure 12:
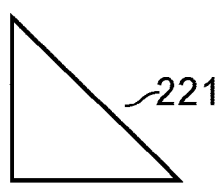

A step 311 adjusts this spectrum to the "right spectral form", which in this case is a spectrum 221 shown schematically in FIG. 12. Referring to the more detailed discussion of FIG. 7, the step 311 involves evaluating the spectrum 209, which as shown schematically in FIG. 10 is a symmetric spectrum formed of two halves, retaining the first half (FIG. 11) except the very first (dc) element to give a power spectrum 114. This is then interpolated to a log scale along the x (frequency band or bin) axis with fewer bands or bins then the spectrum 114. For example, the number of frequency bands can be reduced to, for example, 20 bands, and the y (amplitude) scale is converted to a log representation, providing the spectrum 221 of FIG. 12. The result of the processing just described is that this represents a downsampled version of the spectrum 114.

In examples, the generation of the spectra 221, 243 can involve frequency-transforming (207) the sequence of power values for respective windows of source input samples to generate an intermediate frequency domain representation (209) according to a first plurality of frequency bands; and downsampling (311) the intermediate frequency domain representation to generate the first frequency domain representation having a second plurality of frequency bands than the intermediate frequency domain representation, the second plurality being lower than the first plurality; and in which the second frequency domain representation has the second plurality of frequency bands (such as 20 bands).

Figure 13A:
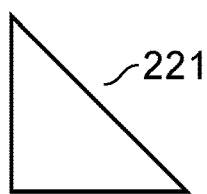
Figure 13B:
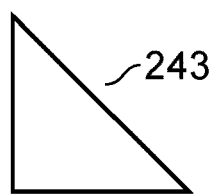

In the example shown in FIG. 6, corresponding processing is applied to the target audio signal 123 using steps 225, 229, 333 to generate intermediate signals 227 (equivalent to 205), 231 (equivalent to 209) and 243 (equivalent to 221). FIGS. 13a and 13b respectively show the spectral profiles 221 (for the source audio signal 101) and 243 (for the target audio signal 123).

Figure 14:

At a step 245, the difference is evaluated between the spectral profiles 221 and 243 so as to provide a difference representation 247 (FIG. 14).

A step 349 involves setting the difference values 247 to the "right difference value form" which, as shown in more detail in FIG. 7, involves converting the y axis back to a linear scale, interpolating the x axis back to a linear scale with the original number of elements (that is to say, the number of elements in the spectrum 209) and rebuilding the spectrum at a step 251 by reflecting the spectrum in the x axis.

Figure 15:
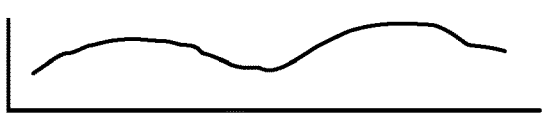
Figure 16:
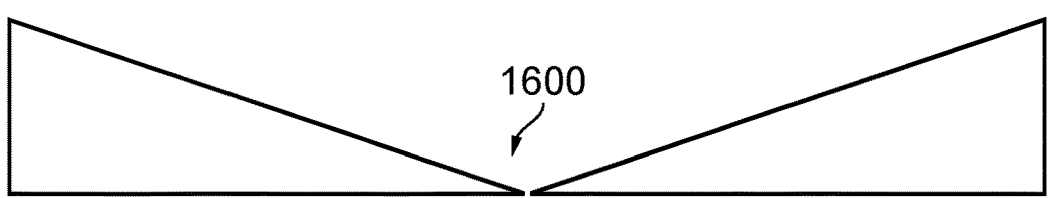
Figure 17:

These processes are shown in FIGS. 15 to 17, in that FIG. 15 shows the difference 247 interpolated back to the original number of elements in the spectrum 209. FIG. 16 shows the form of the reflection used (a reflection around a frequency position 1600).

Returning to FIG. 6, the spectrum 252 is multiplied at a step 253, term by term, (which is to say [band or bin] by [band or bin]) by the spectrum 209 to produce the spectrum 255 (FIG. 17) required of the output signal to be generated.

In examples, the method therefore comprises generating (245) an intermediate difference representation (247) in dependence upon a difference between the first frequency domain representation of the sequence of power values for respective windows of the source input samples and the second frequency domain representation of the sequence of power values for respective windows of the target input samples; upsampling (349) the intermediate difference representation to the first plurality of frequency bands to generate an upsampled intermediate difference representation (252); and combining (253) the upsampled intermediate difference representation with the intermediate frequency domain representation to generate the frequency domain difference representation.

A step 257 involves performing an inverse frequency transform (the inverse of the transform formed at the step 207, 229) on the spectrum 255 to generate an indication 259 representing the RMS power, window by window, required of the output signal.

Figure 18:
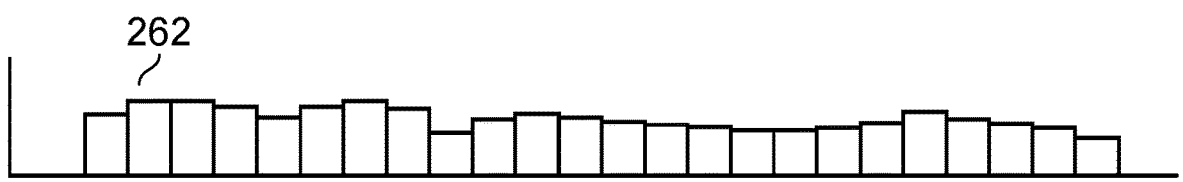

At a step 261, this indication 259 is divided by corresponding windows of the source window RMS power values 205 to generate a representation 262 referred to in FIG. 6 as the "RMS automation" but which represents a gain modification, window by window, to be applied to the source audio signal 101. FIG. 18 schematically represents the RMS automation 262.

The step 261 therefore provides an example of comparing the modification indication with the sequence of power values for respective windows of source input samples to generate a correction indication (262) for applying to the source input samples, for example after an operation of upsampling (263) the correction indication to the same number of samples as the number of source input samples.

Figure 19:

At a step 263, the RMS automation 262 is interpolated to the length of the source audio signal 101 to give a modification indication 1900 shown in FIG. 19 (similar in form to the signal shown in FIG. 2c described above). This is then multiplied, term by term (sample by sample) at a step 265 by the source audio signal samples to generate the output signal 267 (FIG. 2d).

Comparing the summary processes of FIGS. 3 and 4 with FIG. 6, an example mapping is:

first and second frequency domain representations: 221, 243 step 300: step 245 through to generation of the difference indication as 252 or 255 step 310: step 257 through to generation of the modification indication as 259 or 262 step 320: at least the step 265 but possibly including the steps 261 and/or 263 step 400: step 203 step 410: at least step 207, possibly also including step 311 as well As an example of apparatus to implement the methods discussed above, FIG. 20 schematically represents signal processing apparatus comprising:

comparator circuitry 2000 configured to compare a first frequency domain representation of a sequence of power values for respective windows of source input samples of a source input signal with a second frequency domain representation of a sequence of power values for respective windows of target input samples of a target input signal so as to generate a frequency domain difference representation;

transform circuitry 2010 configured to inverse-frequency-transform the frequency domain difference representation to generate a modification indication; and output circuitry 2020 to apply the modification indication to the source input samples to generate respective output samples of an output signal.

The input to the comparator input circuitry 2000 can be either the spectral profiles 221, 243 generated by the processors of FIG. 6 (which is to say, the steps 203, 207, 311 for the spectral profile 221 or the steps 225, 229, 333 for the spectral profile 243) all can be provided as metadata 2030 (for the spectral profile 221 or 2040 for the spectral profile 233).

This allows repeated applications of the process of FIG. 6 without necessarily needing to recreate the profile information each time. For example, the same target profile may be applied to multiple source audio signals, or in alternative arrangements, the same source audio signal may be processed according to multiple target profiles. The metadata can be generated and potentially stored by the process of FIG. 4 discussed above. Note that even if metadata 2030 is provided to give the spectral profile 231 of the source audio signal 101, the source audio signal itself is still required by the output circuitry 2020 in order to perform the step 265 of FIG. 6 to generate the output signal 267.

Note that in at least some embodiments, the metadata may include not only the spectrum 221 (243) but also the power values 205 (227) and/or the spectrum 209 (231). Alternatively, since the spectrum 221 can be generated from the spectrum 209 which in turn can be generated from the values 205, any one or more of the values/spectra 205, 209, 221 (or 227, 231, 243 for the target) may be provided as metadata so as either to reduce the need for processing leading up to the step 245, or to eliminate the need for processing leading up to the step 245 in that branch of FIG. 6. If at least the values 205 (227) are provided then the others can readily be derived from that data.

In the case that metadata is not used, then (still referring to FIG. 20) a detector 2002 is provided in the source signal path (and/or a detector 2102 in the target signal path) and a generator 2004 is provided in the source signal path (and/or a detector 2104 in the target signal path). For the respective signal the detector 2002, 2102 is configured to detect the sequence of power values for the respective windows of the respective input samples. For the respective signal the generator 2004, 2104 is configured to generate at least the frequency domain representation of the sequence of power values.

Figure 20:
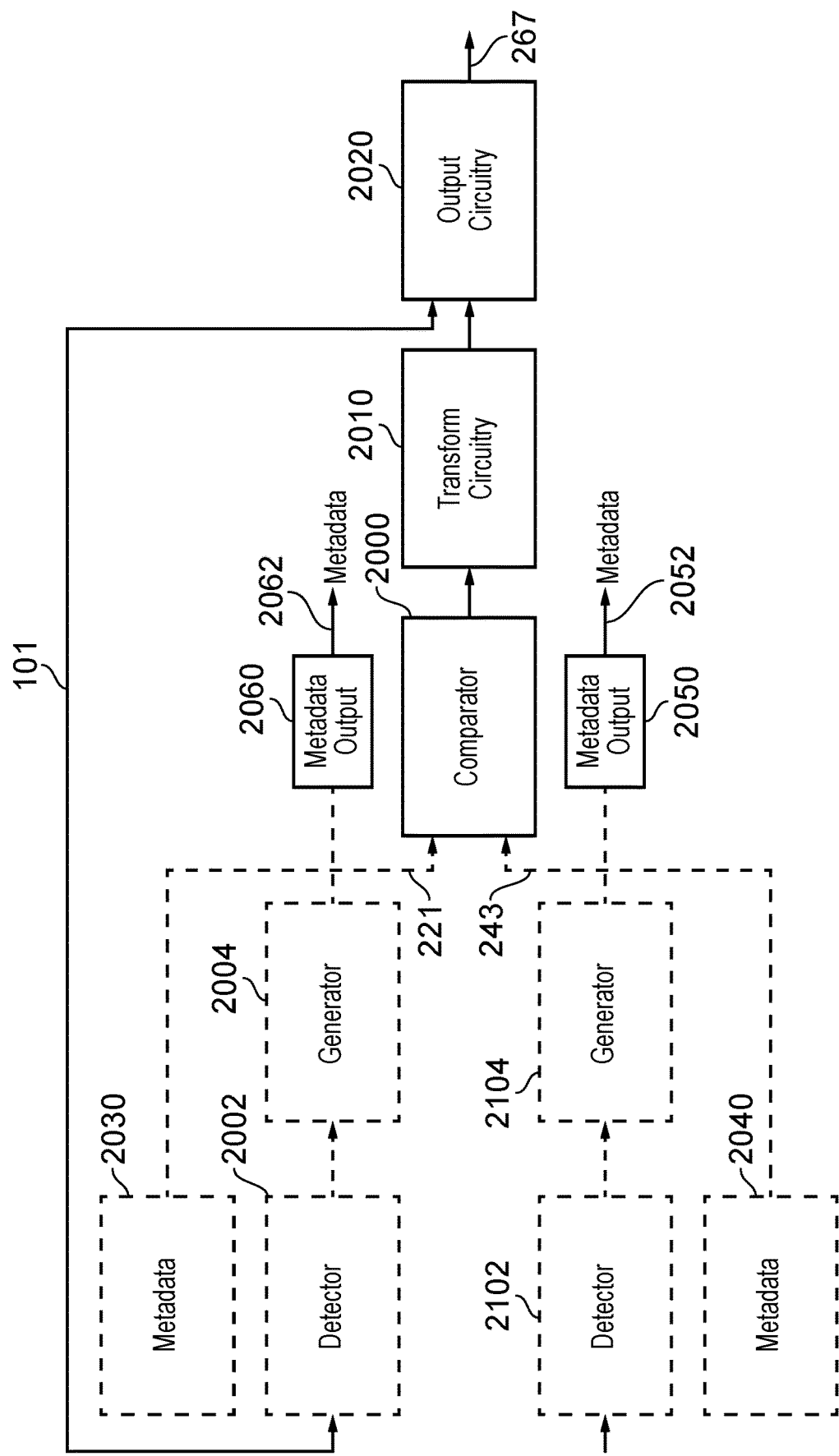
FIG. 20 schematically illustrates a signal processing apparatus.

In a separate mode of operation, the circuitries 2002, 2004 can be used in conjunction with metadata output circuitry 2060, and the circuitries 2102, 2104 can be used in conjunction with metadata output circuitry 2050, to generate and provide metadata 2062, 2052 for the source and target signals respectively. This can be performed as a separate process to the remainder of the processing carried out in FIG. 20, which is to say that an apparatus could be provided which has the circuitries 2002, 2004, 2060 and/or the circuitries 2102, 2104, 2050 only, in order just to derive the metadata discussed above. In this way, the arrangement of FIG. 20 provides an example of signal processing apparatus comprising: detector circuitry 2002, 2102 configured to detect a sequence of power values for respective windows of input samples of an input signal; generator circuitry 2004, 2104 configured to generate a frequency domain representation of the sequence of power values; and output circuitry 2060, 2050 configured to provide the frequency domain representation of the sequence of power values as a metadata signal to accompany the input signal.

Figure 21:
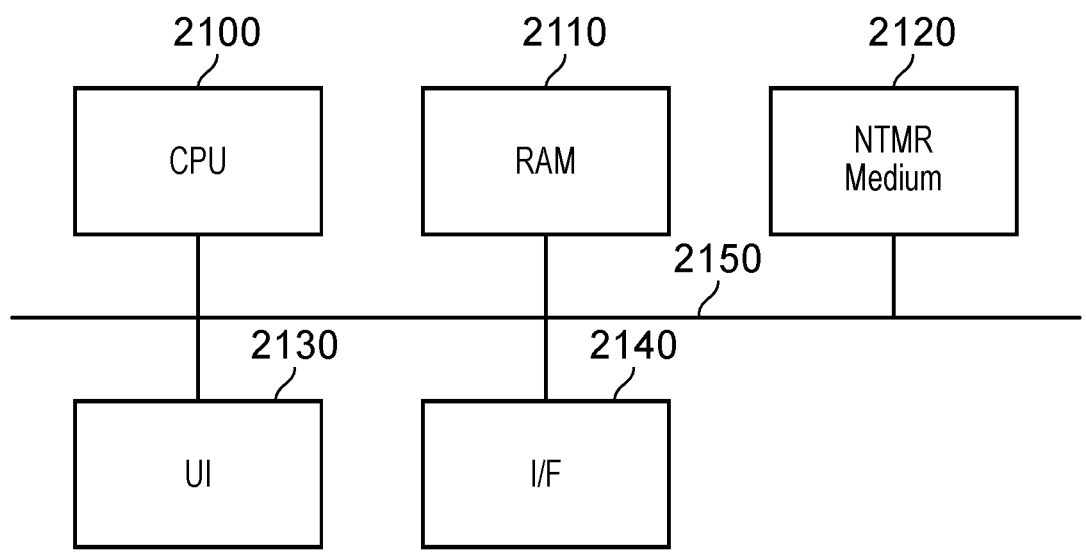
FIG. 21 schematically illustrates a data processing apparatus.

As an alternative implementation FIG. 21 schematically illustrates a data processing apparatus suitable to carry out the methods discussed above under the control of suitable programming instructions, comprising a central processing unit or CPU 2100, a random access memory (RAM) 2110, a non-transitory machine-readable memory or medium (NTMRM) 2120 such as a flash memory, a hard disc drive or the like, a user interface such as a display, keyboard, mouse, or the like 2130, and an input/output interface 2140. These components are linked together by a bus structure 2150. The CPU 2100 can perform any of the above methods under the control of program instructions stored in the RAM 2110 and/or the NTMRM 2120. The NTMRM 2120 therefore provides an example of a non-transitory machine-readable medium which stores computer software by which the CPU 2100 perform the method or methods discussed above.

Figure 22:
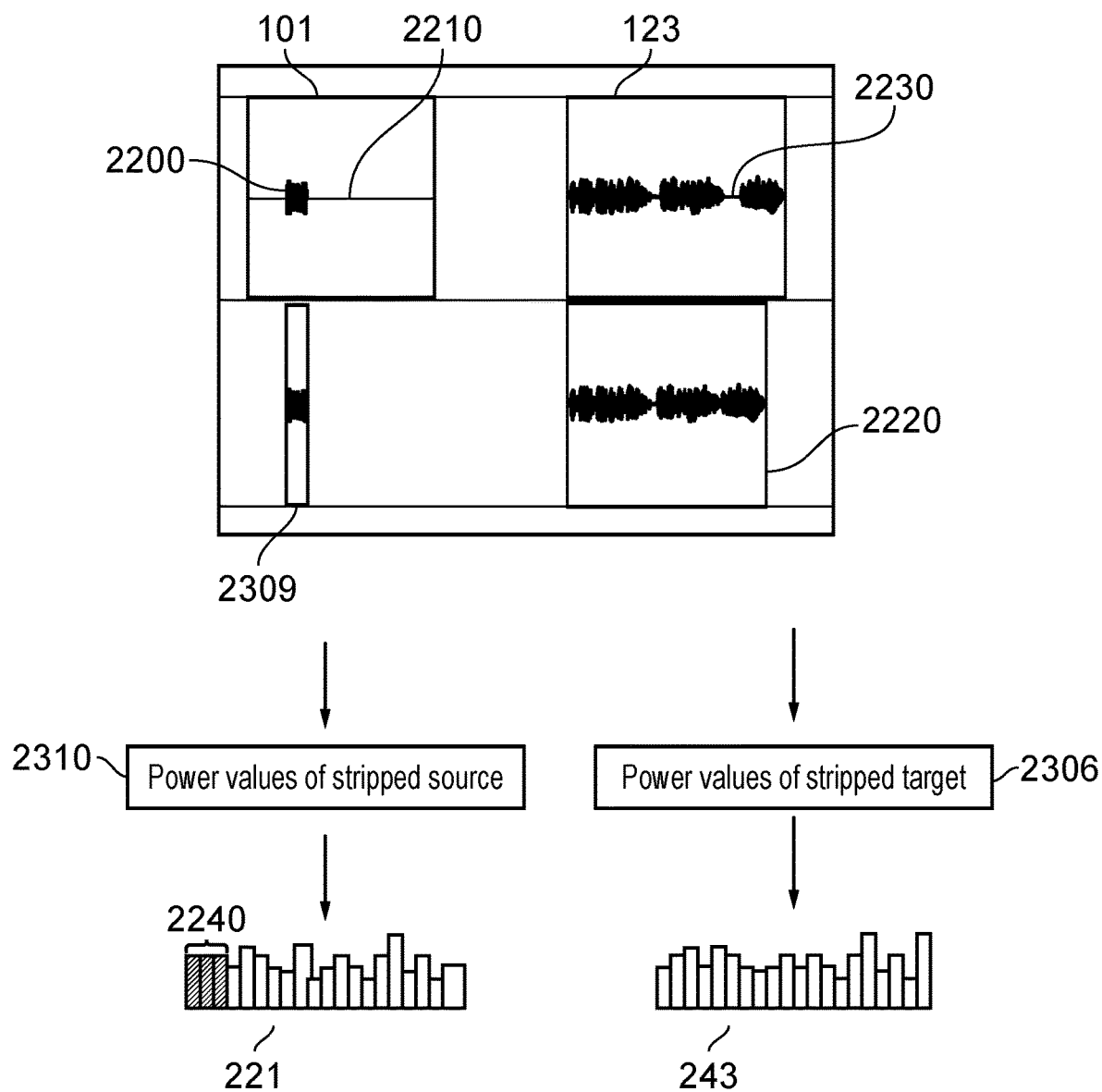
FIGS. 22 and 23 schematically illustrate a silence removal process.
Figure 23:
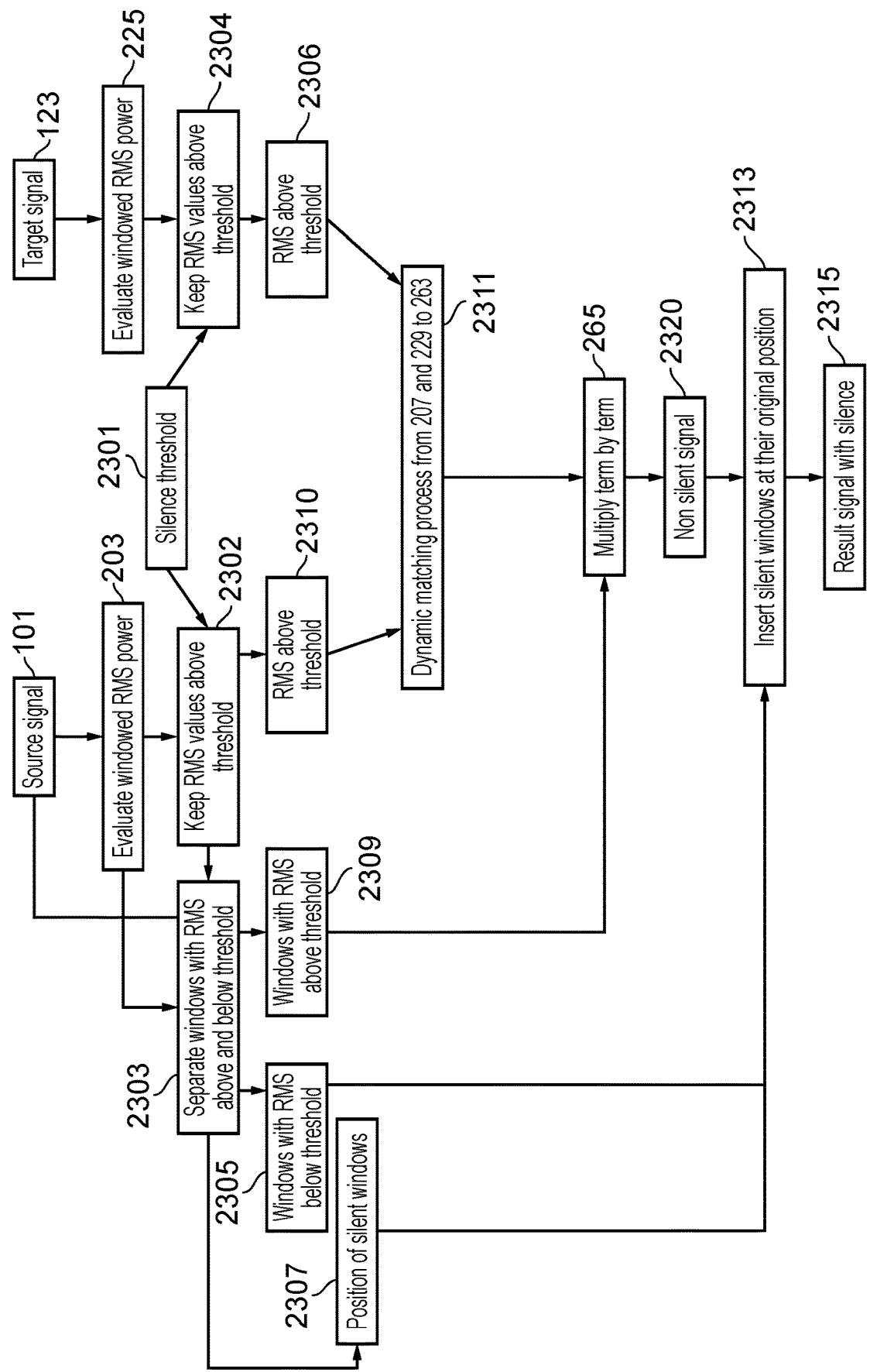

FIGS. 22 and 23 provide alternative and additional arrangements for use in the case of input signals containing significant periods of silence (in the example of audio signals) or low magnitude samples (in the case of other types of signals). In FIG. 22, the source audio signal 101 is represented as having a relatively short portion 2200 of non-silence, with the remainder being silence 2210. Here, "silence" is taken to be represented by a window (of the type used in the step 203 of FIG. 6) having an RMS power value below a threshold power value.

For the purposes of processing to be discussed below, the periods 2210 of silence can be removed ("stripped" away from) the source audio signal to leave a stripped signal 2309. Similarly, with respect to the target audio signal 123, a version 2220 can be envisaged in which periods 2230 of silence have been stripped out. In actual fact, in the processing to be discussed below, no specific use is made of the stripped target audio signal 2220, but it is drawn here for the sake of the present description.

A set of power values 2310 takes the place of the set 205 and contains power values for the stripped source signal 2309. Similarly, a set of power values 2306 takes the place of the set 227 and contains power values of the stripped target signal 2220. Both of these signals can be generated as discussed below either by stripping the silence portions from the audio signals and then taking window power values or, more conveniently, starting with all of the windowed power values and stripping away the power values representing windows classified as silence.

In terms of the spectral profile of the source (221) and target (223) RMS power, depending on the length of the stripped signal 2309, 2220, or alternatively depending on the number of power values in the respective sets 2310, 2306, it may be that one or more spectral bands do not have validly associated data in the spectral profiles 221, 243 (for example, because very low frequency components of the power values cannot be represented when the set of power values is not long enough). In the example of FIG. 22, a set of bands 2240 in the spectral profile 2241 do not contain valid frequency domain power data because the length of the stripped portion 2309 is so short as to not allow the derivation of very low frequency power components such as those represented by the components 2240.

In such cases, when such invalid components occur in any of (one or both of) the spectral profiles, the processing of FIG. 6 is amended so as to set the corresponding values in the difference 247 to a difference which is neutral (that is to say, 1 in a multiplicative system (linear domain) or 0 in an additive system (log domain).

Note that the same consideration may apply to high frequency components in the instance that the individual window length (used to generate the windowed power values) is too long.

This handling of invalid components provides an example of generating a frequency domain difference representation indicative of no difference in respect of any frequency bands for which a valid frequency domain representation of power values is unavailable for one or both of the source input samples and the target input samples, given the length of the windows of the source input samples, the length of the windows of the target input samples, the number of source input samples and the number of target input samples.

Referring to FIG. 23, potential modifications to the process of FIG. 6 is described in more detail, relating to the use of stripped signals so as to remove silence portions.

A silence threshold 2301 is defined, relating to the RMS power values. After the evaluation of the windowed RMS power at the step 203 and at the step 225, the RMS power values are compared at steps 2302 and 2304 with the silence threshold 2301. RMS power values 2310, 2306 above the threshold are retained and the dynamic matching process from 207 onwards is performed at a step 2311.

The skilled person will appreciate that although this test includes the actual threshold value 2301 in the "silence" category, the test could instead be expressed as silence being represented by power values less than a threshold, and non-silence as greater than or equal to the threshold.

It will also be appreciated that the term "silent" refers to an analytical test such as comparison of RMS power with a threshold value, rather than necessarily to a subjective interpretation. It is also noted that the respective thresholds used at the steps 2302 and 2304 may be the same or may be different.

On the source signal side, using the results of the comparison at the step 2302, the windowed RMS power values are partitioned into (i) windows of the source signal 2309 with the RMS power value above the threshold which are passed to the step 265 in FIG. 6 and (ii) windows 2305 with the RMS power value below the threshold. The windows 2305 of the source signal are provided to a step 2313 at which the non-silent processed signal 2320 from the modified step 265 has the silent windows reinserted at their original positions in the source signal 101, so as to generate an output or result signal 2315 which once again includes the silent portions at their original positions within the audio file.

In other words, the silent portions are removed for the purposes of the majority of the processing of FIG. 6 and are then reinserted to recreate the output signal. In order to avoid the introduction of artefacts at the reinsertion step 2313, a short duration (for example, 20% of the length of one window) cross-fade can be introduced whenever a reinserted silent window is adjacent to a process non-silent window.

It will also be appreciated (and this is particularly shown in the example of FIG. 22) that the portions of silence may differ between the source and target signals. This would lead to sets of power values 2310, 2306 of different lengths, implying that the respective spectra 209, 231 are of different numbers of bands or bins. However, the downsampling steps 217, 239 can still be to the same number of bands or bins (for example, 20 for source and target) so that a valid comparison can still be made at the step 245.

The silence processing discussed above provides an example of disregarding power values indicative of windows having less than a threshold power prior to the generating step. In some examples, as shown by the reinsertion step 2313, windows of source input samples having less than a threshold power can be removed for the processing and then reinserted into the output signal.

Figure 24:
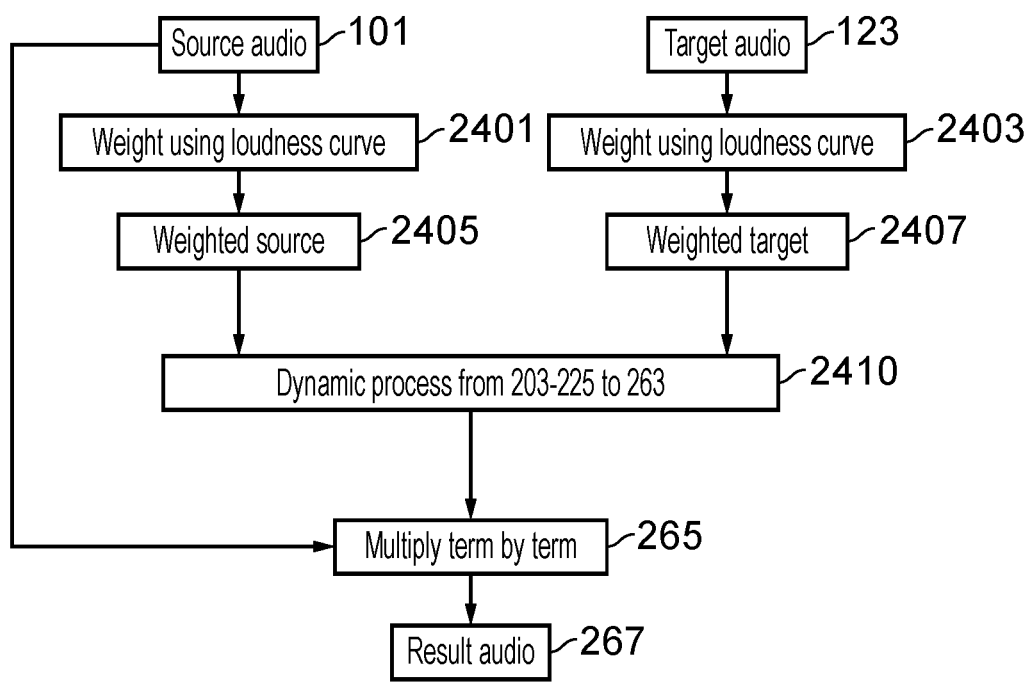
FIG. 24 schematically illustrates a weighting process.

FIG. 24 concerns a variation of the process of FIG. 6, which could apply with or without the variation discussed above with reference to FIGS. 22 and 23, in which the process of FIG. 6 is carried out with respect to so-called loudness weighted audio signals, for example with the loudness weighting applied before the generating step. Here, both the source audio signal 101 and the target audio signal 123 are processed to generate so-called loudness representations 2405, 2407 by steps 2401 and 2403 respectively.

Loudness relates to a measure of the human perception of sound intensity. The perception varies with audio frequency, so a loudness weighting is a frequency-dependent adjustment to account for the different contributions of various frequencies to the human perception of volume. Some systems of loudness weighting, if applied at the steps 2401, 2403, would in fact just cancel out at the comparison step 245. However, a family of so-called multi-band loudness weightings do not cancel out and are therefore useful in this context.

The process of steps 203 to 225 through to 263 of FIG. 6 is carried out as a summary step 2410 with respect to the weighted signals 245, 267. However, the steps 265 is carried out with respect to the original non-weighted source audio samples 101 to generate the output signal 267.

Figure 25:
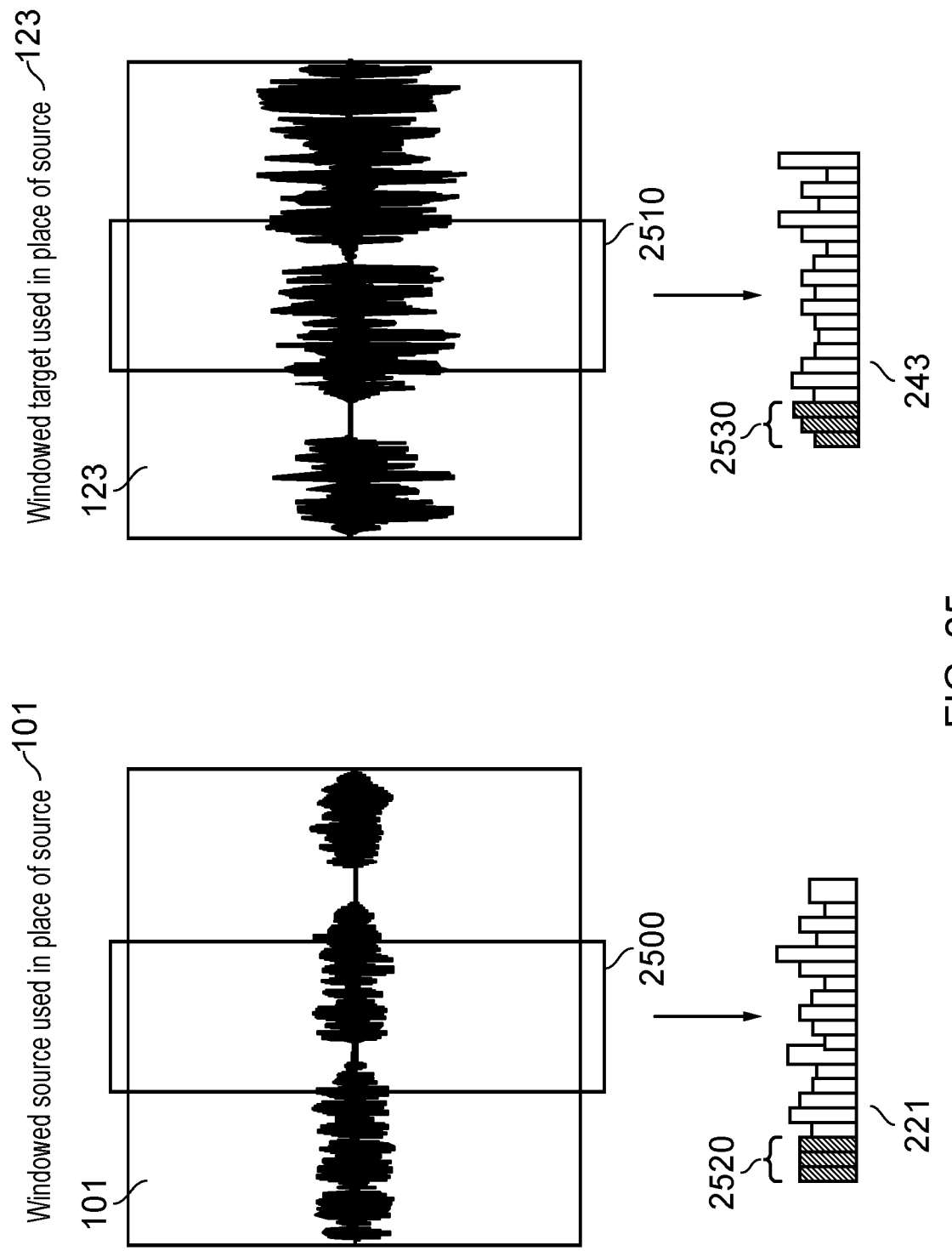
FIG. 25 schematically illustrates a windowing process.

Finally, FIG. 25 concerns a further alternate or additional modification of the process FIG. 6, in which, instead of using an entire file of samples of the source audio signal 101 and/or the target audio signal 123, a windowed portion 2500, 2510 is processed by the steps 203/225 . . . 265.

Depending on the length of the windows 2500, 2510, there may be values 2520, 2530 in the spectral profiles 221, 243, for which valid spectral profiles of the RMS power values cannot be obtained. Once again, in these instances, the different 247 is set to neutral at those spectral positions.

As discussed, in at least some embodiments the source input signal and the target input signal are sampled audio signals; and the windows are time windows. For example, the time windows of the source input samples may be equal in length to one another; and the time windows of the target input samples may be equal in length to one another. In some examples the time windows each have a length of at least 50 milliseconds, this value corresponding to the limit of normal human pitch perception at 20 kHz.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Similarly, a data signal comprising coded data generated according to the methods discussed above (whether or not embodied on a non-transitory machine-readable medium) is also considered to represent an embodiment of the present disclosure.

It will be apparent that numerous modifications and variations of the present disclosure are possible in light of the above teachings. It is therefore to be understood that within the scope of the appended clauses, the technology may be practised otherwise than as specifically described herein.

Various respective aspects and features will be defined by the following numbered clauses:

1. A signal processing method comprising:
   comparing a first frequency domain representation of a sequence of power values for respective windows of source input samples of a source input signal with a second frequency domain representation of a sequence of power values for respective windows of target input samples of a target input signal so as to generate a frequency domain difference representation;

inverse-frequency-transforming the frequency domain difference representation to generate a modification indication; and applying the modification indication to the source input samples to generate respective output samples of an output signal.

2. A method according to clause 1, comprising the steps of:
    detecting the sequence of power values for the respective windows of the target input samples; and
    generating the second frequency domain representation of the sequence of power values.

3. A method according to clause 2, comprising the step of:
    disregarding power values indicative of windows having less than a threshold power prior to the generating step.

4. A method according to clause 2 or clause 3, in which the target input samples represent an audio signal, the method comprising:
    prior to the generating step, applying a loudness weighting to the target input samples.

5. A method according to any one of the preceding clauses, comprising the steps of:
    detecting the sequence of power values for the respective windows of source input samples of the source input signal; and
    generating the first frequency domain representation of the sequence of power values.

6. A method according to clause 5, comprising the step of:
    disregarding power values indicative of windows having less than a threshold power prior to the generating step.

7. A method according to clause 5 or clause 6, in which the source input samples represent an audio signal, the method comprising:
    prior to the generating step, applying a loudness weighting to the source input samples.

8. A method according to any one of the preceding clauses, comprising:
    removing windows of source input samples having less than a threshold power; and
    reinserting the removed windows into the output signal.

9. A method according to any one of clauses 5 to 8, in which the generating step comprises:
    frequency-transforming the sequence of power values for respective windows of source input samples to generate an intermediate frequency domain representation according to a first plurality of frequency bands; and
    downsampling the intermediate frequency domain representation to generate the first frequency domain representation having a second plurality of frequency bands than the intermediate frequency domain representation, the second plurality being lower than the first plurality;
    and in which the second frequency domain representation has the second plurality of frequency bands.

10. A method according to clause 9, in which the comparing step comprises:
    generating an intermediate difference representation in dependence upon a difference between the first frequency domain representation of the sequence of power values for respective windows of the source input samples and the second frequency domain representation of the sequence of power values for respective windows of the target input samples;
    upsampling the intermediate difference representation to the first plurality of frequency bands to generate an upsampled intermediate difference representation; and
    combining the upsampled intermediate difference representation with the intermediate frequency domain representation to generate the frequency domain difference representation.

11. A method according to any one of the preceding clauses, in which the applying step comprises:
    comparing the modification indication with the sequence of power values for respective windows of source input samples to generate a correction indication; and
    applying the correction indication to the source input samples.

12. A method according to clause 11, comprising:
    upsampling the correction indication to the same number of samples as the number of source input samples.

13. A method according to any one of the preceding clauses, in which:
    the source input signal and the target input signal are sampled audio signals; and
    the windows are time windows.

14. A method according to clause 13, in which:
    the time windows of the source input samples are equal in length to one another; and
    the time windows of the target input samples are equal in length to one another.

15. A method according to clause 14, in which the time windows each have a length of at least 50 milliseconds.

16. A method according to any one of the preceding clauses, in which the comparing step comprises generating a frequency domain difference representation indicative of no difference in respect of any frequency bands for which a valid frequency domain representation of power values is unavailable for one or both of the source input samples and the target input samples, given the length of the windows of the source input samples, the length of the windows of the target input samples, the number of source input samples and the number of target input samples.

17. Computer software comprising program instructions which, when executed by a computer, cause the computer to perform the method of any one of the preceding clauses.

18. A non-transitory, machine-readable medium which stores computer software according to clause 17.

19. A signal processing method comprising:
    detecting a sequence of power values for respective windows of input samples of an input signal;
    generating a frequency domain representation of the sequence of power values; and
    providing the frequency domain representation of the sequence of power values as a metadata signal to accompany the input signal.

20. Computer software comprising program instructions which, when executed by a computer, cause the computer to perform the method of clause 19.

21. A non-transitory, machine-readable medium which stores computer software according to clause 20.

22. A non-transitory machine-readable medium which stores the target input signal and the metadata signal provided by the providing step of clause 19.

23. Signal processing apparatus comprising:
  comparator circuitry configured to compare a first frequency domain representation of a sequence of power values for respective windows of source input samples of a source input signal with a second frequency domain representation of a sequence of power values for respective windows of target input samples of a target input signal so as to generate a frequency domain difference representation;
  transform circuitry configured to inverse-frequency-transform the frequency domain difference representation to generate a modification indication; and
  output circuitry to apply the modification indication to the source input samples to generate respective output samples of an output signal.

24. Signal processing apparatus comprising:
  detector circuitry configured to detect a sequence of power values for respective windows of input samples of an input signal;
  generator circuitry configured to generate a frequency domain representation of the sequence of power values; and
  output circuitry configured to provide the frequency domain representation of the sequence of power values as a metadata signal to accompany the input signal.

The invention claimed is:

1. A signal processing method comprising:
  comparing a first frequency domain representation of a sequence of power values for respective windows of source input samples of a source input signal with a second frequency domain representation of a sequence of power values for respective windows of target input samples of a target input signal to generate a frequency domain difference representation with respect to spectral profiles of the source input signal and the target input signal, wherein the source input signal has different content than the target input signal;
  inverse-frequency-transforming the frequency domain difference representation to generate a dynamic matching modification; and
  applying the dynamic matching modification to the source input samples to generate respective output samples of an output signal having the content of the source input signal with the spectral profile of the target input signal.

2. A method according to claim 1, comprising:
  detecting the sequence of power values for the respective windows of the target input samples; and
  generating the second frequency domain representation of the sequence of power values.

3. A method according to claim 2, comprising:
  disregarding power values indicative of windows having less than a threshold power prior to generating the second frequency domain representation.

4. A method according to claim 2, in which the target input samples represent an audio signal, the method comprising:
  prior to generating the second frequency domain representation, applying a loudness weighting to the target input samples.

5. A method according to claim 1, comprising:
  detecting the sequence of power values for the respective windows of source input samples of the source input signal; and
  generating the first frequency domain representation of the sequence of power values.

6. A method according to claim 5, comprising:
  disregarding power values indicative of windows having less than a threshold power prior to generating the first frequency domain representation.

7. A method according to claim 5, in which the source input samples represent an audio signal, the method comprising:
  prior to generating the first frequency domain representation, applying a loudness weighting to the source input samples.

8. A method according to claim 1, comprising:
  removing windows of source input samples having less than a threshold power; and
  reinserting the removed windows into the output signal.

9. A method according to claim 5, in which generating the first frequency domain representation comprises:
  frequency-transforming the sequence of power values for respective windows of source input samples to generate an intermediate frequency domain representation according to a first plurality of frequency bands; and
  downsampling the intermediate frequency domain representation to generate the first frequency domain representation having a second plurality of frequency bands than the intermediate frequency domain representation, the second plurality being lower than the first plurality;
  and in which the second frequency domain representation has the second plurality of frequency bands.

10. A method according to claim 9, wherein comparing comprises:
  generating an intermediate difference representation in dependence upon a difference between the first frequency domain representation of the sequence of power values for respective windows of the source input samples and the second frequency domain representation of the sequence of power values for respective windows of the target input samples;
  upsampling the intermediate difference representation to the first plurality of frequency bands to generate an upsampled intermediate difference representation; and
  combining the upsampled intermediate difference representation with the intermediate frequency domain representation to generate the frequency domain difference representation.

11. A method according to claim 1, wherein applying comprises:
  comparing the dynamic matching modification indication with the sequence of power values for respective windows of source input samples to generate a correction indication; and
  applying the correction indication to the source input samples.

12. A method according to claim 11, comprising:
  before applying the correction indication, upsampling the correction indication to the same number of samples as the number of source input samples.

13. A method according to claim 1, in which:
  the source input signal and the target input signal are sampled audio signals; and
  the windows are time windows.

14. A method according to claim 13, in which:
  the time windows of the source input samples are equal in length to one another; and
  the time windows of the target input samples are equal in length to one another.

15. A method according to claim 14, in which the time windows each have a length of at least 50 milliseconds.

16. A method according to claim 1, wherein comparing comprises generating a frequency domain difference representation indicative of no difference in respect of any frequency bands having an invalid frequency domain representation of power values for one or both of the source input samples and the target input samples, given the length of the windows of the source input samples, the length of the windows of the target input samples, the number of source input samples and the number of target input samples.

17. A non-transitory computer readable medium having computer readable program instructions which, when executed by a computer, cause the computer to perform the method of claim 1.

18. A non-transitory, machine-readable medium which stores computer readable program instructions which, when executed by a computer, cause the computer to perform the method of claim 9.

19. A signal processing method comprising:
  detecting a sequence of power values for respective windows of input samples of a first input signal;
  generating a frequency domain representation of the sequence of power values that forms a first spectral profile;
  providing the frequency domain representation of the sequence of power values as a metadata signal for comparing a sequence of power values for respective windows of input samples of a second input signal that forms a second spectral profile with the metadata signal, wherein one of the first and second input signal as a target input signal and another one of the first and second input signal is a source signal, the target input signal and the source input signal having different content; and
  generating respective output samples of an output signal having the content of the source input signal with the spectral profile of the target input signal.

20. A non-transitory computer readable medium having computer readable program instructions which, when executed by a computer, cause the computer to perform the method of claim 19.

21. A signal processing method of claim 19, further comprising storing the target input signal and the metadata signal.

22. Signal processing apparatus comprising:
  comparator circuitry configured to compare a first frequency domain representation of a sequence of power values for respective windows of source input samples of a source input signal with a second frequency domain representation of a sequence of power values for respective windows of target input samples of a target input signal to generate a frequency domain difference representation with respect to spectral profiles of the source input signal and the target input signal, wherein the source input signal has different content than the target input signal;
  transform circuitry configured to inverse-frequency-transform the frequency domain difference representation to generate a dynamic matching modification; and
  output circuitry to apply the dynamic matching modification to the source input samples to generate respective output samples of an output signal having the content of the source input signal with the spectral profile of the target input signal.

23. Signal processing apparatus comprising:
  detector circuitry configured to detect a sequence of power values for respective windows of input samples of a first input signal;
  generator circuitry configured to generate a frequency domain representation of the sequence of power values that forms a first spectral profile;
  output circuitry configured to provide the frequency domain representation of the sequence of power values as a metadata signal for comparing a sequence of power values for respective windows of input samples of a second input signal that forms a second spectral profile with the metadata signal, wherein one of the first and second input signal as a target input signal and another one of the first and second input signal is a source signal, the target input signal and the source input signal having different content; and
  generating respective output samples of an output signal having the content of the source input signal with the spectral profile of the target input signal.

24. Signal processing apparatus of claim 22, further comprising:
  generating circuitry configured to generate the first frequency domain representation for the comparator circuitry, the generating circuitry configured to:
  frequency-transform the sequence of power values for respective windows of source input samples to generate an intermediate frequency domain representation according to a first plurality of frequency bands; and
  downsample the intermediate frequency domain representation to generate the first frequency domain representation having a second plurality of frequency bands than the intermediate frequency domain representation, the second plurality being lower than the first plurality; and in which the second frequency domain representation has the second plurality of frequency bands.

* * * * *